United States Patent
Cholet

(10) Patent No.: US 8,501,533 B2
(45) Date of Patent: Aug. 6, 2013

(54) METHOD OF ETCHING A PROGRAMMABLE MEMORY MICROELECTRONIC DEVICE

(75) Inventor: Stéphane Cholet, Fontenay Aux Roses (FR)

(73) Assignee: Altis Semiconductor, Corbeil Essonnes (FR)

( * ) Notice: Subject to any disclaimer, the term of this patent is extended or adjusted under 35 U.S.C. 154(b) by 47 days.

(21) Appl. No.: 13/328,038

(22) Filed: Dec. 16, 2011

(65) Prior Publication Data

US 2012/0168704 A1 Jul. 5, 2012

(30) Foreign Application Priority Data

Dec. 29, 2010 (FR) ...................................... 10 61337

(51) Int. Cl.
*H01L 21/06* (2006.01)

(52) U.S. Cl.
USPC ....................... 438/102; 438/690; 204/192.32

(58) Field of Classification Search
None
See application file for complete search history.

(56) References Cited

U.S. PATENT DOCUMENTS

| 6,831,019 | B1 | 12/2004 | Li et al. |
| 2003/0194865 | A1 | 10/2003 | Gilton |
| 2005/0274942 | A1 | 12/2005 | Kozicki |
| 2009/0111212 | A1* | 4/2009 | Lowrey et al. ............... 438/102 |
| 2010/0129938 | A1* | 5/2010 | Kumura et al. .................. 438/3 |

OTHER PUBLICATIONS

International Search Report dated Oct. 26, 2011.

* cited by examiner

*Primary Examiner* — Charles Garber
*Assistant Examiner* — Reema Patel
(74) *Attorney, Agent, or Firm* — Sofer & Haroun, LLP

(57) ABSTRACT

A method of etching a programmable memory microelectronic device (10) having a substrate covered with at least one of the following layers in succession: a first electrode (2) based on a first metallic element; a layer (4) of chalcogenide doped with a second metallic element; a second electrode (5) based on a third metallic element; a diffusion barrier type electrically-conductive layer (6); and a hard mask (7); is provided. The method includes etching, using an inert gas plasma, at least the hard mask (7), the electrically-conductive layer (6), the second electrode (5) and the chalcogenide layer (4), where the etching step is carried out by cathode sputtering at a temperature strictly less than 150° C., preferably at a temperature of at most 120° C., and particularly preferably at a temperature of at most 100° C.

15 Claims, 2 Drawing Sheets

METHOD OF ETCHING A PROGRAMMABLE MEMORY MICROELECTRONIC DEVICE

RELATED APPLICATION

This application claims the benefit of priority from French Patent Application No. 10 61337, filed on Dec. 29, 2010, the entirety of which is incorporated by reference.

BACKGROUND

1. Field of the Invention

The present invention relates to a method of etching a programmable memory microelectronic device and to a programmable memory electronic device obtained by said method.

2. Description of Related Art

Programmable memory microelectronic devices are typically, but not exclusively, programmable ionic conduction (metallization) cells, which are computer memories known as "non-volatile" computer memories. Such programmable ionic conduction cells are known by the acronyms CBRAM, standing for "conductive-bridging random access memory", or PMC, for "programmable metallization cell".

That type of microelectronic structure (CBRAM or PMC) is described in Document U.S. Pat. No. 6,084,796, for example.

A CBRAM (or PMC) typically comprises a vertical stack of layers formed by a substrate based on a silicon type semiconductor on which the following layers are deposited in succession: an electrode termed the bottom electrode, a layer of a chalcogenide glass doped with silver (i.e. solid electrolyte), and an electrode termed the top electrode formed from silver. The layer of a chalcogenide glass is interposed between the bottom electrode and the top electrode.

Said electrodes are configured to cause a metallic dendrite to grow (i.e. formation of an electrically-conductive bridge) from the negative of the two electrodes towards the positive of the two electrodes through the layer of doped chalcogenide glass when a voltage is applied between said electrodes. By applying an opposite voltage between said two electrodes, the reverse phenomenon is obtained, namely disappearance of the metallic dendrite (i.e. disappearance of the electrically-conductive bridge) within the doped chalcogenide glass layer.

Thus, when the electrically-conductive bridge is created (the step known as "writing"), the logic state of the device may be represented by "1", or may correspond to the "ON" state, while when the electrically-conductive bridge disappears, the logic state of the cell may be represented by "0" or may correspond to the "OFF" state.

In order to produce the motifs for the CBRAM microelectronic structure, etching of the top electrode and the doped chalcogenide glass is routinely carried out using a hard mask. Said etching is conventionally carried out at high temperature in a metal etching chamber using a plasma.

However, numerous defects appear after said etching step, not only at the surface of the layers not covered by the hard mask, known as the "open surfaces", but also at the ends of the etched layers.

Said defects are linked to the various metallic elements contained in the microelectronic layers of the CBRAM structure, such as the silver contained in the chalcogenide glass layer and in the top electrode. Said metallic elements are non-volatile elements, but are chemically highly reactive and highly mobile.

More particularly, the metallic defects at the surface of the open layers originate from vertical migration of said metallic elements in the CBRAM stack. In addition, the metallic defects at the ends of the etched layers are the cause of horizontal migration of metallic elements in the CBRAM stack.

Said metallic defects significantly degrade the quality of microelectronic CBRAM structures and thus limit their electrical performance or even render them non-functional.

OBJECTS AND SUMMARY

The present invention aims to overcome the disadvantages of prior art techniques, in particular by proposing a method of plasma etching of a programmable memory electronic device that can be used to significantly limit or even avoid the appearance of metallic defects in said device while guaranteeing a highly satisfactory rate of etching (i.e. very good industrial productivity).

The present invention provides a method of etching a programmable memory microelectronic device comprising a substrate covered with at least one of the following layers in succession:
- a first electrode (i.e. bottom electrode) based on a first metallic element;
- a layer of chalcogenide doped with a second metallic element;
- a second electrode (i.e. top electrode) based on a third metallic element;
- a diffusion barrier type electrically-conductive layer; and
- a hard mask;
- the method comprising a step consisting in etching, using an inert gas plasma, at least the hard mask, the electrically-conductive layer, the second electrode and the chalcogenide layer;
- the etching step being characterized in that it is carried out by cathode sputtering at a temperature strictly less than 150° C., preferably at a temperature of at most 120° C., and particularly preferably at a temperature of at most 100° C.

The first, second, and third metallic elements may be identical or different.

The Applicant has surprisingly discovered that by limiting the temperature during the plasma etching method of the invention, the metallic defects disappear to a significant extent.

As a consequence, activation of the mobility of the metallic elements, especially silver, in the microelectronic device of the invention is greatly limited during the etching step of the invention, and thus the density of metallic defects after etching is significantly reduced thereby.

Plasma Etching Step

According to the present invention, the etching attack on the hard mask is substantially less rapid than the etching attack on the second electrode so that at the end of the etching step, the hard mask is not completely etched (i.e. eliminated).

More particularly, the etching step depends on two parameters, namely the rate of etching and the thickness of the layers to be etched.

Thus, the skilled person can cause at least one of these two parameters to be varied; by way of example, the skilled person can:
i. act on the difference in etching rate between the hard mask and the second electrode;
ii. act on the difference in thickness between the hard mask and the second electrode;
iii. act on parameters i. and ii.

The etching step of the invention is conventionally carried out in an etching chamber comprising a sample carrier. More particularly, the temperature at which etching by cathode sputtering is carried out is the temperature of said sample carrier on which the programmable memory electronic device is positioned, the portion in physical contact with the sample carrier being the substrate.

Cathode sputtering using an inert gas plasma is a method that is well known to the skilled person and is used in particular to deposit thin layers of a material by condensing a metal vapor derived from a solid source (i.e. target) on a substrate positioned on a sample carrier.

In the context of the present invention, the target corresponds to a vertical stack of layers in accordance with the invention. For this reason, a target that is independent of said stack is not necessary. The aim of cathode sputtering is to remove at least a portion, preferably all of the second electrode and the layer of chalcogenide not protected by the hard mask.

Thus, more particularly, the cathode sputtering etch of the invention is that known as mechanical etching, or in other words etching that is not chemical etching, namely it does not involve combining two materials to form a third, for example by chemical condensation.

The etching chamber used to carry out the method of the invention may be an etching chamber that is a soft mask or resin mask dielectric etching chamber.

Preferably, the inert plasma gas used in the method of the invention is a chemically inactive gas plasma.

More particularly, said chemically inactive gas plasma may comprise just one or a plurality of chemically inactive gases.

The chemically inactive gas or gases may be selected from elements from column 18 (VIIIA) of the periodic classification of the elements, such as argon (Ar), helium (He), or neon (Ne), for example.

The Programmable Memory Microelectronic Device

The programmable memory microelectronic device of the invention typically comprises a vertical stack of layers formed by a substrate on which the following layers are deposited in succession: the first electrode based on a first metallic element, the layer of chalcogenide doped with the second metallic element, the second electrode based on a third metallic element, the electrically-conductive layer, and the hard mask.

Other layers that are well known to the skilled person may be interposed between those mentioned above.

The Substrate

In the present invention, the term "substrate" may include any type of structure.

Particular examples that may be mentioned are semiconductor substrates that may, as is conventional, be based on silicon and/or quartz. As an example, the semiconductor substrate may be selected from substrates of silicon, of silicon oxide, and of quartz.

The semiconductor substrate may, for example, comprise semiconductors of the silicon on insulator (SOI) type, silicon on sapphire (SOS) type, doped or non-doped semiconductor type, or of the type formed by silicon layers grown epitaxially on a semiconductor base. Processing steps may be used to form regions or junctions in or over the semiconductor base.

The substrate is not necessarily semiconductive, but may be any type of support structure adapted to support an integrated circuit. As an example, the substrate may be formed from a ceramic or be based on a polymer.

As an example, the substrate may have a thickness in the range 150 μm [micrometer] to 400 μm, or even up to 800 μm.

The First and the Second Electrodes

The first and second electrodes are metallic electrodes, respectively based on a first and a third metallic element, produced and deposited using techniques that are well known to the skilled person. They respectively correspond to an anode and to a cathode, or vice versa.

The first metallic element may typically be selected from nickel, tungsten, a nickel alloy, and a tungsten alloy.

The third metallic element may typically be selected from silver and an alloy of silver such as silver tantalate, for example.

In a particular embodiment, the programmable memory microelectronic device of the invention may also comprise an electrically-insulating layer (i.e. dielectric layer) interposed between the substrate and the chalcogenide layer.

Said electrically-insulating layer may be positioned at the same (horizontal) level as the first electrode, and more particularly it may extend on either side of the first electrode. The chalcogenide layer thus remains in electrical contact with the first electrode.

When the programmable memory microelectronic device comprises at least two stacks, said electrically-insulating layer can be used to insulate a first stack electrically from a second stack, the two stacks being positioned side by side in the operational configuration.

Preferably, the thickness of said electrically-insulating layer is identical to that of the first electrode.

As an example, said electrically-insulating layer may be a layer of silicon nitride ($Si_3N_4$).

The Chalcogenide Layer

The layer of doped chalcogenide is conventionally interposed between the first and the second electrode in order to be able to form electrically-conductive bridges when a voltage is applied between these two electrodes. As a consequence, the layer of chalcogenide must be in physical contact with the two electrodes.

More particularly, for CBRAMs (or PMCs), the two electrodes are configured to cause a metallic dendrite to grow (i.e. to form an electrically-conductive bridge) from the negative of the two electrodes towards the positive of the two electrodes through the layer of doped chalcogenide when a voltage is applied between said electrodes. Applying an opposite voltage between said two electrodes produces the reverse phenomenon, namely disappearance of the metallic dendrite (i.e. disappearance of the electrically-conductive bridge) in the doped intermediate layer.

Thus, if an intermediate layer is positioned between an electrode and the chalcogenide layer, it is essential that the chalcogenide layer is in electrical contact with said electrode, for example via conductive materials that can electrically connect the chalcogenide layer to said electrode.

In accordance with the invention, the constituent material of the chalcogenide layer comprises a chalcogenide composed of at least one chalcogen ion and at least one electropositive element. More particularly, said material may be a chalcogenide glass.

A chalcogenide may be represented by the following formula: $A_xB_{100-x}$, in which A is an electropositive element, B is a chalcogen ion, and x is an integer in the range 1 to 99.

The constituent chalcogens of the chalcogen ions are conventionally those in group 16 of the periodic classification of the elements and those that are preferably used in the invention are sulfur (S), selenium (Se), and tellurium (Te).

More particularly, the constituent electropositive element of the chalcogenide may be:

an element from group 14 (i.e. group IVA) of the periodic classification of the elements, in particular silicon (Si), or germanium (Ge); or an element from group 15 (i.e. group VA) of the periodic classification of the elements, in particular phosphorus (P), arsenic (As), antimony (Sb), or bismuth (Bi).

Preferably, said electropositive element is germanium (Ge) or arsenic (As).

Typically, a chalcogenide glass is used when the electropositive chalcogenide element belongs to group 14 or to group 15 of the periodic classification of the elements.

Examples of chalcogenides that may be mentioned are germanium selenide, $Ge_xSe_{100-x}$, germanium sulfide $Ge_xS_{100-x}$, or arsenic sulfide $As_xS_{100-x}$, x being an integer in the range 1 to 99.

The preferred chalcogenide is germanium sulfide, $Ge_xS_{100-x}$, in particular where x=33 (i.e. $GeS_2$).

The second, metallic element, which is the element doping the chalcogenide, is preferably silver.

In a preferred embodiment, the second metallic element is identical to the third metallic element.

In another preferred embodiment, the second metallic, element and/or the third metallic element is silver.

The Electrically-Conductive Layer

The electrically-conductive layer of the invention, of the intermediate layer type, allows a screen to be produced against the diffusion of mobile metallic elements comprised in particular in the subjacent or lower layers of the microelectronic device.

In particular, the conductive layer is intended to constitute a diffusion barrier to at least one of the three metallic elements, preferably to the second and third metallic elements.

As an example, said diffusion barrier type conductive layer is a layer of titanium (Ti), a titanium alloy such as titanium nitride (TiN), tantalum, or an alloy of tantalum such as tantalum nitride (TaN), for example.

The Hard Mask

The hard mask of the invention may comprise an electrically-conductive layer and/or an electrically-insulating layer (i.e. dielectric layer).

In a first embodiment, the hard mask may comprise one or more electrically-conductive layers.

In a second embodiment, the hard mask may comprise the electrically-insulating layer deposited on the electrically-conductive layer.

Further, the intermediate layer type electrically-conductive layer and the electrically-conductive layer of the hard mask may be one and the same layer.

More particularly, the electrically-insulating layer of the hard mask is a layer of an electrically-insulating material such as a dielectric layer of an oxide (for example silicon oxide). The electrically-conductive layer is a layer of an electrically-conductive material such as a metallic layer of titanium nitride, for example.

In a further aspect, the invention provides a programmable memory microelectronic device obtained from the method as defined in the present invention.

Said microelectronic device obtained thereby has a density of metallic defects (i.e. visual count of the number of metallic defects per unit surface area) that is three times smaller, preferably ten times smaller, and particular preferably one hundred times smaller than the defect density of an identical device that has undergone an etch step under the same conditions as those specified in the invention, but at a temperature not less than 150° C.

BRIEF DESCRIPTION OF THE DRAWINGS

Further characteristics and advantages of the present invention become apparent from the examples below made with reference to the accompanying drawings, said examples and figures being given by way of non-limiting example.

DETAILED DESCRIPTION

Figure 1:
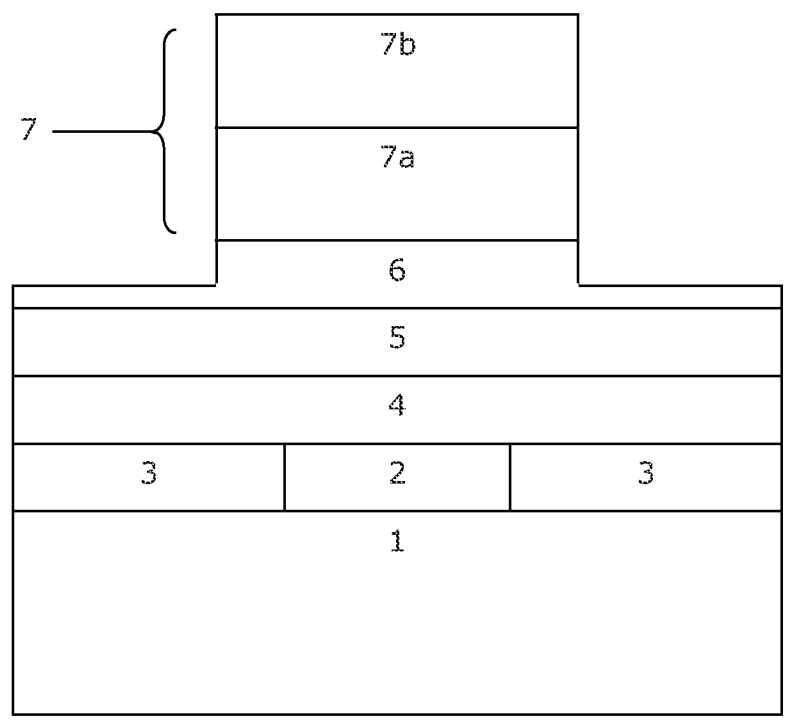
FIG. 1 is a partial cross-sectional view of a stack of layers of a microelectronic device, before etching in accordance with the invention.
Figure 2:
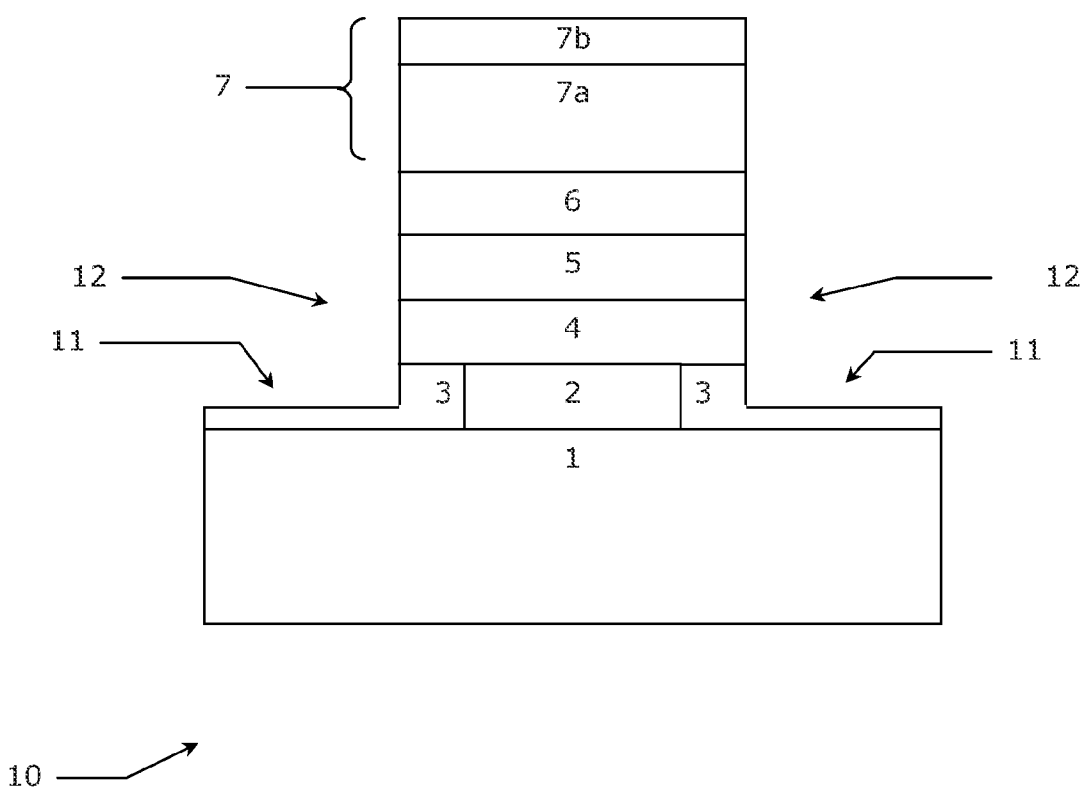
FIG. 2 is a partial cross-sectional view of the stack of layers of FIG. 1 after etching in accordance with the invention.

The adjectives "top", "bottom", "vertical" and "horizontal" are defined in the present invention relative to the position of a microelectronic device as shown in FIGS. 1 and 2.

FIG. 1 represents a particular stack (10) forming a microelectronic device before applying the etching method in accordance with the present invention.

Said stack (10) comprises the following layers in succession:

a substrate (1) comprising at least one layer based on silicon, and optionally a succession of elements well known to the skilled person, the thickness of the substrate being 300 μm;

a layer (2) of tungsten forming the first electrode (or bottom electrode), the thickness of said layer being 100 nm [nanometer];

a layer (3) of silicon nitride ($Si_3N_4$) extends horizontally on either side of the tungsten layer forming the electrically-insulating layer, the thickness of said layer being identical to that of the tungsten layer;

a layer (4) of a $GeS_2$ type chalcogenide glass doped with silver, the thickness of this layer being of the order of 50 nm;

a layer (5) of silver forming the second electrode (or top electrode), the thickness of said layer being of the order of 30 nm;

a layer (6) of tantalum nitride (TaN) forming the electrically-conductive layer, the thickness of this layer being of the order of 10 nm;

a layer (7a) of titanium nitride (TiN) forming the electrically-conductive layer of the hard mask (7), the thickness of said layer being of the order of 50 nm; and a layer (7b) of oxide forming the electrically-insulating layer of the hard mask (7), the thickness of this layer being of the order of 80 nm.

This stack (10) (stack A) was placed in a metal etching chamber, said chamber being marketed by the supplier Applied Materials under reference Hot DPS2.

At the same time, the same stack (stack B) was placed in a dielectric etching chamber, said chamber being marketed by the supplier Applied Materials under reference Cold DPS2.

Inside these two chambers, each said stack was placed on the surface of a sample carrier within said chamber.

The step of etching said stack was carried out by cathode sputtering using an argon plasma for a period of approximately 150 seconds.

The temperatures employed during etching were as follows:

in the "Hot DPS2" chamber, the temperature was 150° C. (comparative test); and in the "Cold DPS2" chamber, the temperature was 60° C. (test in accordance with the invention).

More particularly, the temperature mentioned here was the temperature of the sample carrier on which the stack (10) was positioned, the portion in physical contact with the sample carrier being the substrate (1).

At the end of etching, the surfaces of stacks A and B were observed with an optical microscope supplied by LEICA, using a magnification of 150.

Stack A had a high silver defect density (i.e. a visual count of the number of silver defects per unit surface area). In fact, silver defects were observed:
- at the open surfaces (11), linked to migration or vertical diffusion of silver contained in the layer of silver (5) used as the top electrode, and
- in the layer of chalcogenide (4) doped with silver: this is referred to as silver residues in the open surfaces; and at the ends (12) of the stack A, linked to migration or horizontal diffusion of silver contained in the layer of silver (5) used as the top electrode, and in the layer of chalcogenide (4) doped with silver: this is referred to as silver extrusion defects.

At a temperature of 150° C. or more, the mechanism for the appearance of silver defects after etching is directly linked to the mobility of silver in the stack. Silver has the capacity to move within the stack and generate local inhomogeneities with very concentrated zones of silver.

The stack B itself had a much lower silver defect density (for example one hundred times smaller) than that observed for stack A. Thus, activation of the mobility of the silver contained in stack B has been greatly limited, which means that better control of the diffusion of silver within the layer of chalcogenide can be guaranteed. For this reason, this limitation of silver defects in stack B results in a significant improvement in electrical performance during use of stack B as a CBRAM.

Further, the rate of etching of stack B was substantially the same as the rate of etching of stack A. Thus, there was no loss of productivity.

Thus, the Applicant has discovered a low temperature etching method in particular using a dielectric etching chamber, having a highly satisfactory rate of etching while significantly reducing the quantity of metallic defects after etching.

The invention claimed is:

1. A method of etching a programmable memory microelectronic device having a substrate covered with at least one of the following layers in succession:
    a first electrode based on a first metallic element;
    a layer of chalcogenide doped with a second metallic element;
    a second electrode based on a third metallic element;
    a diffusion barrier type electrically-conductive layer; and
    a hard mask;
    said method comprising the step of:
    etching, using an inert gas plasma, at least the hard mask, the electrically-conductive layer, the second electrode and the chalcogenide layer,
    wherein the etching step is carried out by cathode sputtering at a temperature less than 150° C.

2. The etching method according to claim 1, wherein the etching is mechanical etching.

3. The etching method according to claim 1, wherein the inert gas plasma is a plasma of argon.

4. The etching method according to claim 1, wherein the hard mask comprises an electrically-conductive layer and/or an electrically-insulating layer.

5. The etching method according to claim 4, wherein the electrically-conductive layer is a layer of titanium nitride (TiN).

6. The etching method according to claim 4, wherein the electrically-insulating layer is deposited on the electrically-conductive layer.

7. The etching method according to claim 1, wherein the diffusion barrier type electrically-conductive layer is a layer of tantalum nitride (TaN).

8. The etching method according to claim 1, wherein the layer of chalcogenide comprises $GeS_2$.

9. The etching method according to claim 1, wherein the second metallic element is identical to the third metallic element.

10. The etching method according to claim 1, wherein the second metallic element and/or the third metallic element is silver.

11. The etching method according to claim 1, wherein the programmable memory microelectronic device further comprises an electrically-insulating layer interposed between the substrate and the layer of chalcogenide.

12. The etching method according to claim 11, wherein the electrically insulating layer is a layer of silicon nitride ($Si_3N_4$).

13. A programmable memory microelectronic device obtained from a method according claim 1.

14. The etching method according to claim 1 wherein the etching step is carried out by cathode sputtering at a temperature of at most 120° C.

15. The etching method according to claim 1 wherein the etching step is carried out by cathode sputtering at a temperature of at most 100° C.

* * * * *